United States Patent
Chou et al.

(10) Patent No.: US 11,164,808 B2
(45) Date of Patent: Nov. 2, 2021

(54) SEMICONDUCTOR DEVICES AND METHODS OF MANUFACTURING THE SAME

(71) Applicant: Vanguard International Semiconductor Corporation, Hsinchu (TW)

(72) Inventors: Yu-Chieh Chou, New Taipei (TW); Hsin-Chih Lin, Hsinchu (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/508,946

(22) Filed: Jul. 11, 2019

(65) Prior Publication Data

US 2021/0013120 A1    Jan. 14, 2021

(51) Int. Cl.
| | |
|---|---|
| *H01L 23/373* | (2006.01) |
| *H01L 23/492* | (2006.01) |
| *H01L 29/20* | (2006.01) |
| *H01L 29/66* | (2006.01) |
| *H01L 29/778* | (2006.01) |
| *H01L 21/48* | (2006.01) |
| *H01L 29/205* | (2006.01) |

(52) U.S. Cl.
CPC ...... *H01L 23/3733* (2013.01); *H01L 21/4871* (2013.01); *H01L 23/4922* (2013.01); *H01L 29/2003* (2013.01); *H01L 29/205* (2013.01); *H01L 29/66462* (2013.01); *H01L 29/7787* (2013.01)

(58) Field of Classification Search
CPC ............ H01L 23/4922; H01L 29/7787; H01L 29/66462; H01L 29/2003
See application file for complete search history.

(56) References Cited

U.S. PATENT DOCUMENTS

| | | | |
|---|---|---|---|
| 2013/0015499 A1 | 1/2013 | Briere | |
| 2015/0311142 A1* | 10/2015 | Sekar | H01L 21/823475 257/499 |
| 2019/0172709 A1* | 6/2019 | Odnoblyudov | H01L 27/1203 |

OTHER PUBLICATIONS

Taiwanese Office Action and Search Report for corresponding Taiwanese Application No. 108116653, dated Oct. 31, 2019.

* cited by examiner

*Primary Examiner* — Changhyun Yi
(74) *Attorney, Agent, or Firm* — Birch, Stewart, Kolasch & Birch, LLP

(57) ABSTRACT

A semiconductor device includes a base and a conductive layer to form a composite substrate. The conductive layer covers a surface of the base. The semiconductor device also includes a dielectric layer covering the conductive layer. The conductive layer is disposed between the dielectric layer and the base. The semiconductor device further includes a GaN-containing composite layer, a gate electrode disposed over the GaN-containing composite layer, a source electrode and a drain electrode disposed on the GaN-containing composite layer. The source electrode and the drain electrode are disposed at two opposite sides of the gate electrode. In addition, a method for manufacturing the semiconductor device with a composite substrate is provided.

26 Claims, 7 Drawing Sheets

SEMICONDUCTOR DEVICES AND METHODS OF MANUFACTURING THE SAME

BACKGROUND

Technical Field

The disclosure relates to semiconductor devices and methods of manufacturing the same, and in particular to semiconductor devices with composite substrates and methods of manufacturing the same.

Description of the Related Art

In recent years, the development of semiconductor devices for use in computers, consumer electronics and other fields has progressed rapidly. Currently, semiconductor device technology has been widely accepted in Metal-Oxide-Semiconductor Field-Effect Transistor (MOSFET) products that have a high market share. Semiconductor devices are used in a variety of electronic applications, such as high-power devices, personal computers, cell phones, digital cameras, and other electronic devices. These semiconductor devices are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

Among these devices, high-electron mobility transistors (HEMTs) have been widely used in the field of high-power applications since they have such advantages as high output power and high breakdown voltage. Although existing semiconductor devices and methods for manufacturing the same have been adequate for their intended purposes, they have not been entirely satisfactory in all respects. Therefore, up to the present, there are still some problems to be overcome in regards to semiconductor integrated circuits and technology.

SUMMARY

Some embodiments of the present disclosure provide semiconductor devices. A semiconductor device includes a composite substrate having a base and a conductive layer. The conductive layer covers a surface of the base. The semiconductor device includes a dielectric layer covering the conductive layer, and the conductive layer is disposed between the dielectric layer and the base. The semiconductor device also includes a GaN-containing composite layer disposed on the composite substrate, and a gate electrode disposed on the GaN-containing composite layer. The semiconductor device further includes a source electrode and a drain electrode disposed on the GaN-containing composite layer and located at two opposite sides of the gate electrode.

Some embodiments of the present disclosure methods of manufacturing semiconductor devices. A method includes providing a base and forming a conductive layer on the base, wherein a surface of the base is covered by the conductive layer. The method includes forming a dielectric layer to cover the conductive layer and forming a GaN-containing composite layer above the base, wherein the conductive layer is positioned between the dielectric layer and the base. The method includes also includes forming a source electrode and a drain electrode on the GaN-containing composite layer. The method further includes forming a gate electrode on the GaN-containing composite layer, wherein the gate electrode is located between the source electrode and the drain electrode.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Figure 1A:
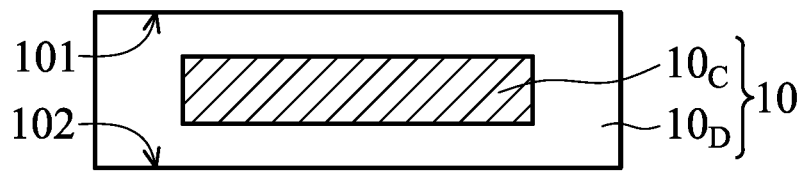
FIG. 1A, FIG. 1B and FIG. 1C illustrate cross-sectional views of intermediate stages of a method for forming a composite substrate and a dielectric layer covering the composite substrate in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor devices and methods of manufacturing the same. An exemplary embodiment of a semiconductor device includes a composite substrate containing a conductive layer. The composite substrate containing a conductive layer can be steadily set on the processing machines, which is suitable for being used in the processing machines for manufacturing the semiconductor device. Electrical properties of electrical components of the semiconductor device fabricated on the steadily set composite substrate can be greatly enhanced. In some embodiments, the conductive layer of the composite substrate includes a conductive material resistant to high temperature such that the composite substrate 10M is suitable for being applied to subsequent high-temperature thermal processes. In some embodiments, the conductive layer of the composite substrate further includes a conductive material with low transmittance or an opaque conductive material. In some embodiments, the conductive layer of the composite substrate includes a conductive material with good heat absorption. Therefore, the temperature of the composite substrate can be controlled in thermal processes. For example, the temperature of the composite substrate can be steadily increased, which greatly improves performances of the electrical components fabricated on the composite substrate 10M. Thus, the yield and the quality of electrical components fabricated on the composite substrate of the embodiments can be significantly enhanced.

Figure 1B:
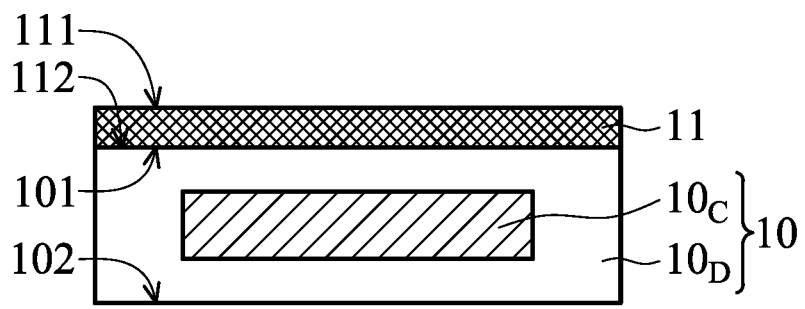
Figure 1C:
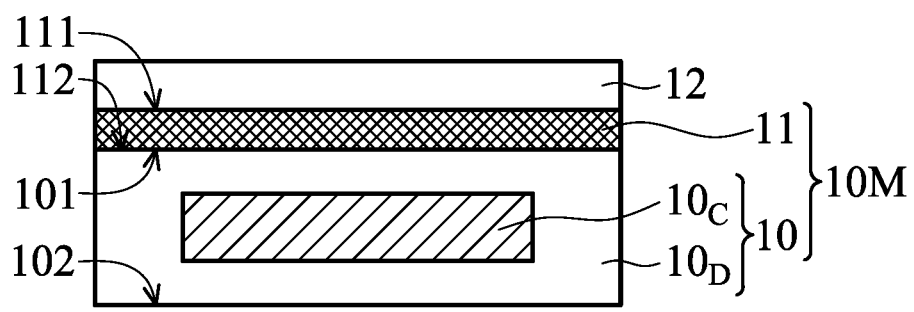

FIG. 1A-FIG. 1C illustrate cross-sectional views of intermediate stages of a method for forming a composite substrate and a dielectric layer covering the composite substrate in accordance with some embodiments of the present disclosure. In some embodiments, a base 10 is provided, as shown in FIG. 1A.

In some embodiments, the base 10 includes a ceramic material, and an insulating material covering the ceramic material. The ceramic material may include a metal inorganic material. In some embodiments, the base 10 includes silicon carbide (SiC), aluminum nitride, sapphire, or other suitable material. The aforementioned sapphire base may be formed by aluminum nitride and gallium nitride formed on the aluminum nitride. In some embodiments, the base 10 has an extremely low conductivity or is not electrically conductive. In some embodiments, the base 10 has a high light transmittance such as greater than 80% transmittance.

In some embodiments, the Young's modulus of the base 10 is greater than that of silicon. For example, the Young's modulus of the base 10 is in a range of about 200 GPa to about 1000 GPa. If the Young's modulus of the base 10 becomes greater, the base 10 can resist more intensive stress. In some embodiments, the toughness of the base 10 is greater than that of the silicon. If the toughness of the base 10 becomes greater, the base 10 can support more weight, thereby resisting more stress. As a result, one or more thicker films may be formed on the base 10 without breaking it. In some embodiments, the hardness of the base 10 is greater than that of silicon. The greater hardness of the base 10 facilitates formation of thicker films.

In some embodiments, the base 10 includes a ceramic material layer $10_C$ and an insulating layer $10_D$ surrounding the periphery of the ceramic material layer $10_C$, as shown in FIG. 1A. In some embodiments, the insulating layer $10_D$ includes a single insulating material layer or several insulating material layers. In some embodiments, the insulating layer $10_D$ includes oxides, nitrides, oxynitrides, or other suitable material. In the drawings of the following embodiments, the base 10 as shown in FIG. 1A, including the ceramic material layer $10_C$ and the insulating layer $10_D$ completely encapsulating the ceramic material layer $10_C$, is exemplified for illustrating some embodiments of the present disclosure.

Next, in some embodiments, one surface of the base 10 is covered by a conductive layer 11, as shown in FIG. 1B. According to some embodiments of the present disclosure, the base 10 and the conductive layer 11 forms a composite substrate 10M. The base 10 has an upper surface 101 and a lower surface 102 opposite the upper surface 101. The conductive layer 11 has a first surface 111 and a second surface 112 opposite the first surface 111. The upper surface 101 of the base 10 is covered by the second surface 112 of the conductive layer 11.

In some embodiments, the conductive layer 11 of the composite substrate 10M includes a metal, an alloy, a metal nitride, polysilicon, one or more suitable conductive materials, or a combination thereof. In some embodiments, the conductive layer 11 includes Ti, Ta, W, Nb, Mo, V, other suitable metals, or alloy including a metal thereof. For example, the conductive layer 11 may include TaAl, TiW, other suitable alloys, or a combination of aforementioned metals. In some embodiments, the conductive layer 11 includes a metal nitride, such as TiN, TaN, TiAlN, TaAlN, WN, NbN, MoN, VN, other suitable metal nitride materials, or a combination thereof.

In some embodiments, the conductive layer 11 includes a conductive material that absorbs heat well. Material examples of the conductive layer 11 including a metal, an alloy, a metal nitride and polysilicon have properties of good heat absorption. In some embodiments, the conductive layer 11 of the composite substrate 10M includes a conductive material with good property of heat absorption such that the conductive layer 11 steadily absorbs heat during a thermal process. Thus, electrical performances of electrical components fabricated on the composite substrate 10M can be significantly improved.

Moreover, in some embodiments, the conductive layer 11 includes a conductive material that has a light transmittance less than 50% or is opaque. For example, the conductive layer 11 containing a metal, an alloy, a metal nitride or polysilicon has a low transmittance or is opaque. Use of a composite substrate 10M containing a conductive layer 11 having a low transmittance or an opaque conductive layer 11 reduces the light penetrating the composite substrate 10M. The composite substrate 10M may absorb more light such that more heat accumulates in the composite substrate 10M. Therefore, the temperature of the composite substrate 10M can be steadily increased in thermal processes, which greatly improves performances of electrical components fabricated on the composite substrate 10M. In some embodiments, the conductive layer 11 of the composite substrate 10M has a light transmittance less than 50%. In some embodiments, the conductive layer 11 of the composite substrate 10M has a light transmittance less than 40%. In some embodiments, the conductive layer 11 of the composite substrate 10M has a light transmittance less than 30%.

In some embodiments, the conductive layer 11 includes a conductive material resistant to a high temperature. When the composite substrate 10M of some embodiments is applied to e high-temperature thermal processes for manufacturing a semiconductor device, the conductive layer 11 is not melted or deformed to affect or contaminate the material layers or components formed on the composite substrate 10M.

In some embodiments, the conductive layer 11 includes a conductive material resistant to a thermal process at a temperature greater than 600° C. In some embodiments, the conductive layer 11 includes a conductive material resistant to a thermal process at a temperature greater than 800° C. In some embodiments, the conductive layer 11 includes a conductive material resistant to a thermal process at a temperature greater than 900° C. In some embodiments, the conductive layer 11 includes a conductive material resistant to a thermal process at a temperature greater than 1000° C. The material of the conductive layer 11 is selected and determined depending on whether it can be resistant to a high temperature of a thermal process performed in practical applications. The descriptive term "resistant" as used herein means that the conductive layer 11 is not melted or deformed after it undergoes a high-temperature thermal process. Also, the high-temperature thermal process does not change the conductivity of the conductive layer 11.

In some embodiment, the conductive layer 11 includes a conductive material resistant to high temperatures, such as a metal, an alloy, a metal nitride, polysilicon, one or more suitable conductive materials, or a combination thereof, as described above. Those conductive materials have high melting points and are resistant to thermal processes, especially resistant to a thermal process at a temperature greater than 600° C. Melting points of some suitable metal materials for forming the conductive layer 11 are exemplified below. For example, titanium (Ti) has a melting point of about 1667° C., tantalum (Ta) has a melting point of about 3269° C., tungsten (W) has a melting point of about 3422° C., niobium (Nb) has a melting point of about 2468° C., molybdenum (Mo) has a melting point of about 2617° C. and vanadium (V) has a melting point of about 1910° C. In some embodiments, the conductive layer 11 includes an alloy. Melting point of alloy is determined by the ratio and melting points of the metals constituting the alloy. For example, if the conductive layer 11 of some embodiments include an alloy composed of two or more metals selected from Nb, Mo, W and Ta, the melting point of the alloy is in a range of about 2468° C. to about 3422° C. Also, melting points of some suitable metal nitrides for forming the conductive layer 11 are exemplified below. For example, TiN has a melting point of about 2960° C., TaN has a melting point of about 3090° C., NbN has a melting point of about 2573° C., MoN has a melting point of about 1750° C. and VN has a melting point of about 2050° C. In addition, polysilicon has a melting point of about 1410° C.

In some embodiments, the conductive layer 11 includes a conductive material having a melting point equal to or higher than about 1400° C. In some embodiments, the conductive layer 11 includes a conductive material having a melting point in a range of about 1400° C. to about 3500° C.

Also, the conductive layer 11 may include one or more conductive material layers. Although a single conductive material layer is depicted in the drawings for illustrating the conductive layer 11, the disclosure is not limited thereto. In some embodiments, the conductive layer 11 is formed on the base 10 by using chemical vapor deposition (CVD), physical vapor deposition (PVD), atomic layer deposition (ALD), electroplating, other suitable deposition process, or a combination thereof.

In some embodiments, the thickness of the conductive layer 11 of the composite substrate 10M is in a range of about 50 nm to about 500 nm. In some embodiments, the thickness of the conductive layer 11 of the composite substrate 10M is in a range of about 100 nm to about 500 nm. It is noted that if the conductive layer 11 of some embodiments containing metal is a thin film with an extremely small thickness, such as less than 10 nm, the conductive layer 11 may become transparent and discontinuous (e.g. presenting discrete islands) on the base 10. Discontinuous state of the conductive layer 11 affects conductivity of the conductive layer 11. If the conductive layer 11 is too thick, excessive stress may be generated to an insulating layer such as an oxide layer or a nitride layer of the base 10, causing the conductive layer 11 peeling from the base 10. In practical applications, thickness of the conductive layer 11 can be adequately selected by considering factors in many aspects, such as the material(s) for forming the conductive layer and the materials of the layers contacting the conductive layer.

Next, in some embodiments, a dielectric layer 12 is formed on the conductive layer 11 and covers the conductive layer 11. As shown in FIG. 1C, the first surface 111 of the conductive layer 11 is covered by the dielectric layer 12. Thus, the conductive layer 11 is positioned between the dielectric layer 12 and the base 10, and covered by the dielectric layer 12.

In some embodiments, the dielectric layer 12 can be one of material layers for forming components of the semiconductor device on the composite substrate 10M. For example, if components of a high-electron mobility transistor (HEMT) are formed on the composite substrate 10M subsequently, the dielectric layer 12 can be a material layer preventing the conductive layer 11 of the composite substrate 10M from directly contacting a GaN-containing composite layer above the composite substrate 10M. In some embodiments, the dielectric layer 12 can be regarded as a layer for protecting the conductive layer 11.

According to some embodiments, one or more material layers for forming related components of the semiconductor device, such as a GaN-containing composite layer and electrodes of a HEMT, can be subsequently deposited on the composite substrate 10M. Steps for forming the composite substrate 10M and forming the material layers of related components on the composite substrate 10M can be modified and adjusted.

In some embodiments, the GaN-containing composite layer can be formed after forming the composite substrate 10M including the conductive layer 11, as described in the method of FIG. 2A-FIG. 2E. Thus, the composite substrate 10M including the conductive layer 11 is not only well clamped on a chuck of a processing machine, but also absorbs heat steadily in a subsequent high-temperature thermal process. In some embodiments, the high-temperature thermal process performed subsequently is a high-temperature annealing process for forming source/drain ohmic contacts. Additionally, in other embodiments, the GaN-containing composite layer can be formed on the surface of the base 10, and then the conductive layer 11 is formed on the other surface of the base 10. Also, the dielectric lave 12 covers the conductive layer 11. That is, fabrication of the composite substrate 10M is completed after forming the GaN-containing composite layer, as described in the method of FIG. 4A-FIG. 4C. Thus, the composite substrate 10M including the conductive layer 11 can be well clamped on a chuck of a processing machine and steadily absorbs heat in a thermal process. Also, the GaN-containing composite layer can be prevented from contamination by the material (e.g. metal) diffusion of the conductive layer 11 at high temperatures.

According to some embodiments of the present disclosure, structures and methods of manufacturing the same with different steps are described below for exemplification.

Figure 2A:
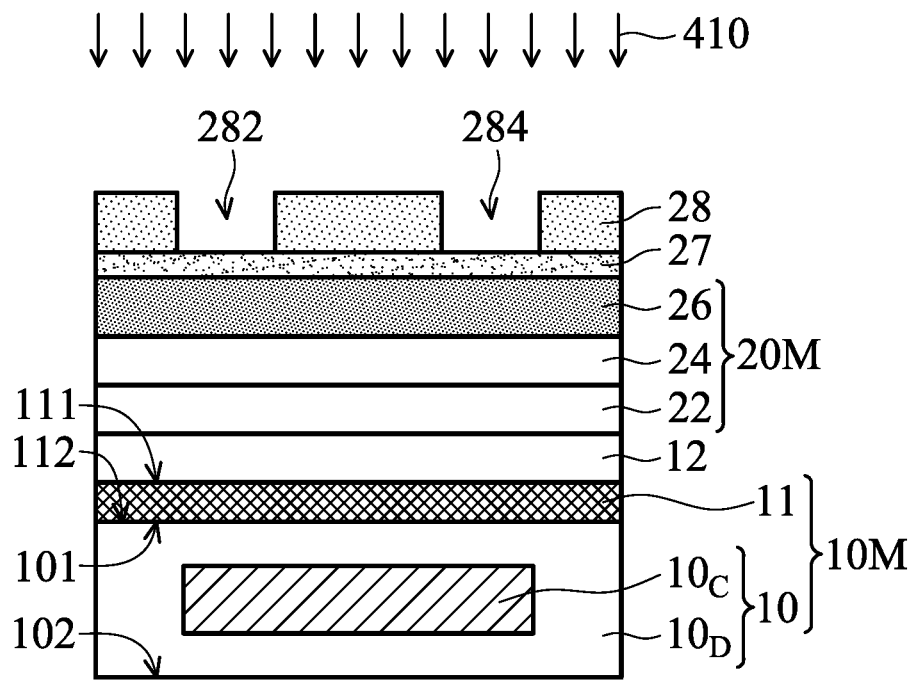
FIG. 2A, FIG. 2B, FIG. 2C, FIG. 2D and FIG. 2E illustrate cross-sectional views of intermediate stages of a method of manufacturing a high electron mobility transistor (HEMT) shown in FIG. 2E in accordance with some embodiments of the present disclosure.
Figure 2B:
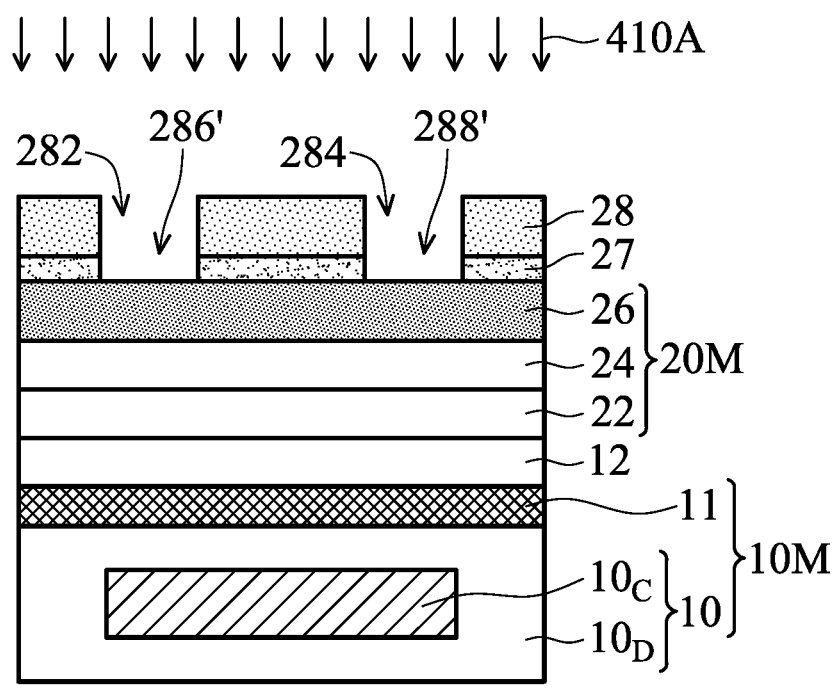
Figure 2C:
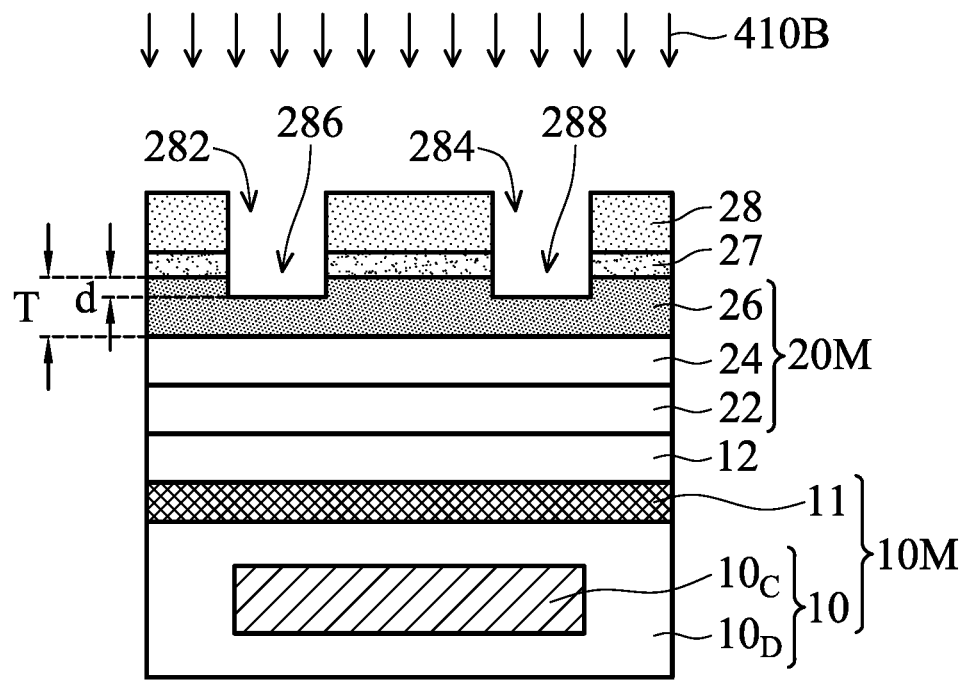
Figure 2D:
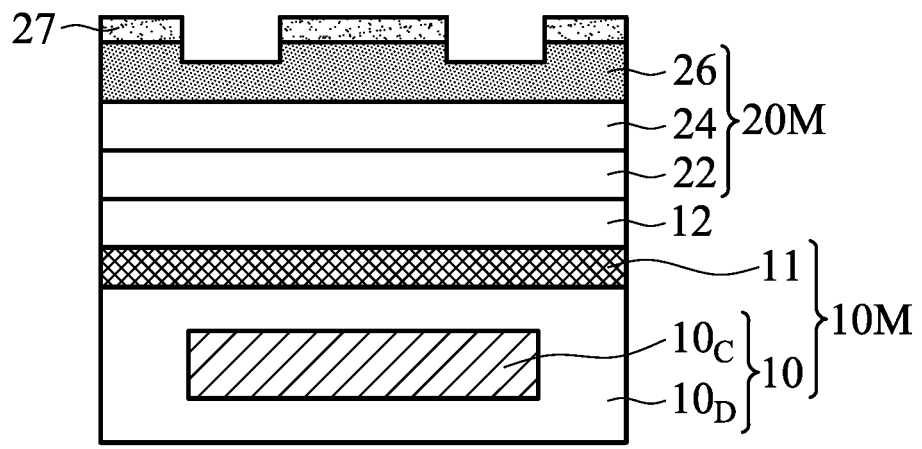
Figure 2E:
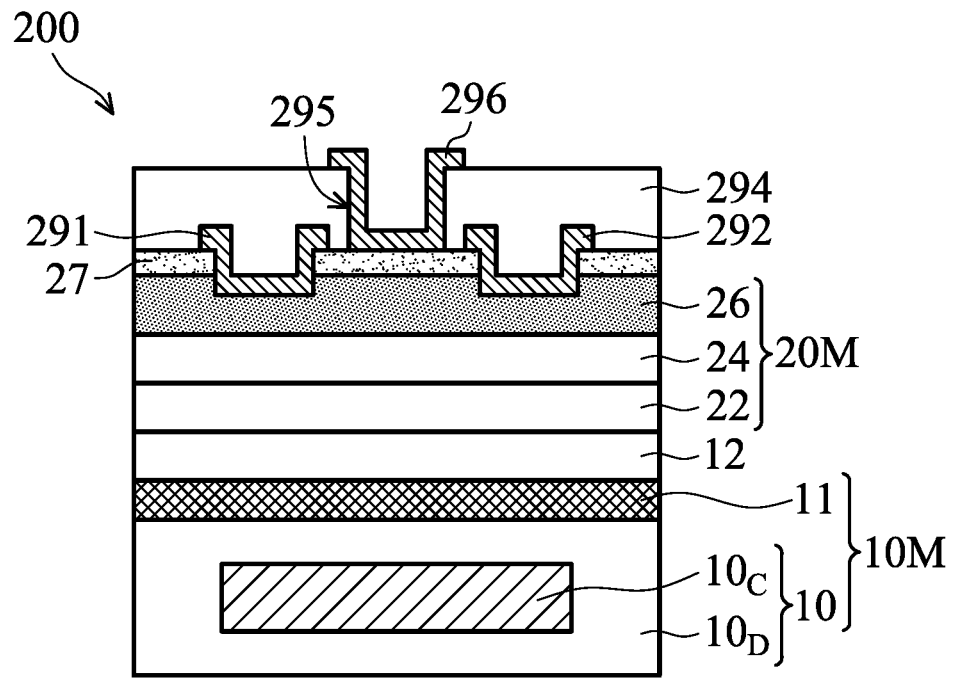

FIG. 2A-FIG. 2E illustrate cross-sectional views of intermediate stages of a method of manufacturing a high electron mobility transistor (HEMT) 200 shown in FIG. 2E in accordance with some embodiments of the present disclosure. Referring to FIG. 2A, a composite substrate 10M (including a base 10 and a conductive layer 11) is provided, and a dielectric layer 12 is formed on the composite substrate 10M to cover the composite substrate 10M. In some embodiments of the present disclosure, the base 10 of the composite substrate 10M includes a ceramic material layer $10_C$ and an insulating layer $10_D$ encapsulating the ceramic material layer $10_C$. Configuration of the base 10 in FIG. 1A is implemented for illustrating the method of FIG. 2A-FIG. 2E. Furthermore, the structure and manufacturing method of the composite substrate 10M may be the same as or similar to that of the composite substrate 10M as shown in FIG. 1A to FIG. 1C. Also, the materials of the conductive layer 11 and the dielectric layer 12 have been described above, and the details are not described repeatedly.

Next, a GaN-containing composite layer 20M is formed above the composite substrate 10M in some embodiments of the present disclosure, the GaN-containing composite layer 20M is formed on the dielectric layer 12. Therefore, in some embodiments, the conductive layer 11 and the dielectric layer 12 are formed between the GaN-containing composite layer 20M and the base 10.

In some embodiments of the present disclosure, the GaN-containing composite layer 20M includes a buffer layer 22, a channel layer 24 on the buffer layer 22 and a barrier layer 26 on the channel layer 24.

In some embodiments of the present disclosure, as shown in FIG. 2A, a buffer layer 22 is formed on the dielectric layer 12. Formation of the buffer layer 22 may be helpful to mitigate a strain of a channel layer 24 which is subsequently formed on the buffer layer 22, and to prevent defects formed in the overlying channel layer 24. The strain is generated due to a mismatch between the channel layer 24 and the composite substrate 10M In some embodiments, the dielectric layer 12 includes silicon oxide, silicon nitride, silicon oxynitride, a combination of thereof, or the like. In some embodiments, the buffer layer 22 includes AlN, GaN, $Al_xGa_{1-x}N$ (wherein 0<x<1), a combination of thereof, or the like. The buffer layer 22 may be formed using an epitaxial growth process, such as metal organic chemical vapor deposition (MOCVD), hydride vapor phase epitaxy (HVPE), molecular beam epitaxy (MBE), a combination thereof, or the like. Although the buffer layer 22 in the embodiment shown in FIG. 2A is a single layer, the buffer layer 22 may be a multilayered structure in other embodiments.

Next, a channel layer 24 is formed on the buffer layer 22. In some embodiments of the present disclosure, the channel layer 24 is a GaN semiconductor layer. A barrier layer 26 is then formed on the channel layer 24. In some embodiments, the barrier layer 26 includes $Al_xGa_{1-x}N$, wherein 0<x<1. There is a heterogeneous interface between the channel layer 24 and the barrier layer 26 so that two-dimensional electron gas (2DEG, not shown) is formed at the heterogeneous interface. Therefore, the high electron mobility transistor (HEMT) 200 as shown in FIG. 2E may utilize 2DEG as conductive carriers. In some embodiments of the present disclosure, the channel layer 24 and the barrier layer 26 are formed by epitaxial growth processes, such as MOCVD, HVPE, MBE, a combination thereof, or the like. In some embodiments, the channel layer 24 and the barrier layer 26 have dopants, such as n-type dopants or p-type dopants.

Next, a silicon-containing insulating layer 27 is formed on the barrier layer 26. In some embodiments of the present disclosure, the silicon-containing insulating layer 27 is a high-quality film formed by using atomic layer deposition (ALD), thermal oxidation or similar deposition processes. The material of the silicon-containing insulating layer 27 may be silicon oxide, silicon nitride, silicon oxynitride, a combination thereof, or the like. Formation of the high-quality film of the silicon-containing insulating layer 27 on the barrier layer 26 can prevent leak currents of a source electrode 291, a drain electrode 292 and a gate electrode 296 (shown in FIG. 2E) that are subsequently formed.

Next, a mask material layer is formed on the silicon-containing insulating layer 27. Openings such as a first opening 282 and a second opening 284 are formed in the mask material layer by using photolithography technique, so that the first opening 282 and the second opening 284 of a mask layer 28 expose portions of an upper surface of the silicon-containing insulating layer 27, as shown in FIG. 2A. In some embodiments of the present disclosure, the mask material layer is a photoresist layer, a hard mask layer (such as a nitride layer) or a combination thereof. In some embodiments of the present disclosure, a bottom anti-reflective coating (BARC) layer (not shown) is formed on the silicon-containing insulating layer 27 following by forming a mask material layer on the BARC layer.

Next, the composite substrate 10M on which the a buffer layer 22, the channel layer 24, the barrier layer 26, the silicon-containing insulating layer 27 and the mask layer 28 are formed is placed into an etching equipment, and then an etching process 410 is performed.

In some embodiments, the etching process 410 is a dry etching process, such as reactive ion etching (RIE), electron cyclotron resonance (ECR) etching, inductively-coupled plasma (ICP) etching, or the like.

In some embodiments of the present disclosure, an etching equipment includes an etching chamber, a gas supply system, a bias power generator, a wafer platform, a shower head and an etching endpoint detector. The gas supply system provides an etchant which is used in the etching process. The bias power generator applies a bias power to the etching chamber to generate a bias electric field between an upper electrode (not shown, generally disposed at the top of the etching chamber) and a lower electrode (not shown, generally disposed inside of the wafer platform) of the etching equipment. The etchant is evenly dispersed into the etching chamber through the shower head. The etching endpoint detector of the etching equipment may real-time monitor etching signals of the desired material layer to be removed in an etching process. During the etching process, the etchant is accelerated by the bias electric field in the etching chamber, and in the direction toward the wafer platform to anisotropically etch the silicon-containing insulating layer 27 and the underlying barrier layer 26 of the GaN-containing composite layer 20M.

In some embodiments of the present disclosure, an etching process including two etching steps can be implemented. Referring to FIG. 2B and FIG. 2C, an etching process including a first etching step 410A and a second etching step 410B are performed. In some embodiments of the present disclosure, the silicon-containing insulating layer 27 and the barrier layer 26 are etched through the first opening 282 and the second opening 284 of the mask layer 28 to form a first recess 286 and a second recess 288, as shown in FIG. 2C.

In detail, as shown in FIG. 2B, a first recess 286' and a second recess 288' are formed in the silicon-containing insulating layer 27 by the first etching step 410A of the etching process 410. Next, as shown in FIG. 2C, the first recess 286' and the second recess 288' are extended into the barrier layer 26 by the second etching step 410B of the etching process 410 to form the first recess 286 and the second recess 288. In some embodiments, as shown in FIG. 2C, the first recess 286 and the second recess 288 extend into the barrier layer 26 by a distance d. The distance d may be in a range of about 5% to about 100% of the thickness T of the barrier layer 26. The distance d may be determined and varied according to carrier concentration and carrier mobility of 2DEG formed in the high electron mobility transistor (HEMT) 200.

In some embodiments of the present disclosure, the first etching step 410A and the second etching step 410B are performed in-situ in the same etching chamber. In other words, after the first etching step 410A is complete, the composite substrate 10M and the layers formed thereon are not moved out of the etching chamber and the second etching step 410B is continuously performed in the etching chamber without interruption. The second etching step 410B and the first etching step 410A of the etching process 410 may use the same etchant (such as a fluorine-containing etchant). Additionally, in some embodiments, the first etching step 410A is performed by applying a first bias power to the etching chamber, and the second etching step 410B is performed by applying a second bias power greater than the first bias power to the etching chamber.

After the etching process 400, an ashing process may be performed to remove the mask layer 28 on the silicon-containing insulating layer 27, as shown in FIG. 2D.

Next, a source electrode 291 and a drain electrode 292 are formed in the first recess 286 and the second recess 288, respectively. Referring to FIG. 2E, the source electrode 291 and the drain electrode 292 are located on and electrically contact the barrier layer 26. In some embodiments, the first recess 286 and the second recess 288 may not be completely filled with the source electrode 291 and the drain electrode 292. The source electrode 291 and the drain electrode 292 are formed along the sidewalls and the bottom surfaces of the first recess 286 and the second recess 288, and extend to portions of the surface of the silicon-containing insulating layer 27, as shown in FIG. 2E.

In some embodiments, the source electrode 291 and the drain electrode 292 are formed of conductive materials, such as Au, Ni, Pt, Pd, Ir, Ti, Cr, W, Al, Cu, TaN, TiN, $WSi_2$, a combination thereof, or the like. The source electrode 291 and the drain electrode 292 may be formed by ALD, chemical vapor deposition (CVD), physical vapor deposition (PVD), electron beam evaporation, sputtering, or the like. In some embodiments, the source electrode 291 and the drain electrode 292 are formed together in the same deposition process. In some embodiments, after a material layer of the source electrode 291 and the drain electrode 292 is deposited, a high-temperature thermal process such as an annealing process is performed to form source/drain ohmic contacts. In some embodiments, the high-temperature thermal process is a rapid thermal annealing process.

Next, a passivation layer 294 is formed on the source electrode 291 and the drain electrode 292. The passivation layer 294 covers the source electrode 291 and the drain electrode 292. In some embodiments of the present disclosure, the passivation layer 294 includes silicon oxide, silicon nitride, silicon oxynitride, a combination of thereof, or the like. In some embodiments, the passivation layer 294 is formed by CVD, plasma enhanced chemical vapor deposition (PECVD), ALD or the like.

Still referring to FIG. 2E, a third recess 295 is formed in the passivation layer 294 by photolithography technology and an etching process. The third recess 295 is located between the source electrode 291 and the drain electrode 292. Next, a gate electrode 296 is formed in the third recess 295 to form a high electron mobility transistor (HEMT) 200. In some embodiments, the gate electrode 296 is located on the silicon-containing insulating layer 27 and between the source electrode 291 and the drain electrode 292. In some embodiments, the third recess 295 is incompletely filled with the gate electrode 296. The gate electrode 296 is formed along the sidewalls and the bottom surface of the third recess 295 and extended onto a portion of the surface of the passivation layer 294, as shown in FIG. 2E. In some embodiments, the material of the gate electrode 296 is a conductive material, such as Au, Ni, Pt, Pd, Ir, Ti, Cr, W, Al, Cu, TaN, TiN, $WSi_2$, or a combination thereof. The gate electrode 296 may be formed by ALD, CVD, PVD, sputtering or the like. The source electrode 291 and the drain electrode 292 may be in electrical contact with external circuitry by a metal layer (not shown) that passes through the passivation layer 294.

Figure 3:
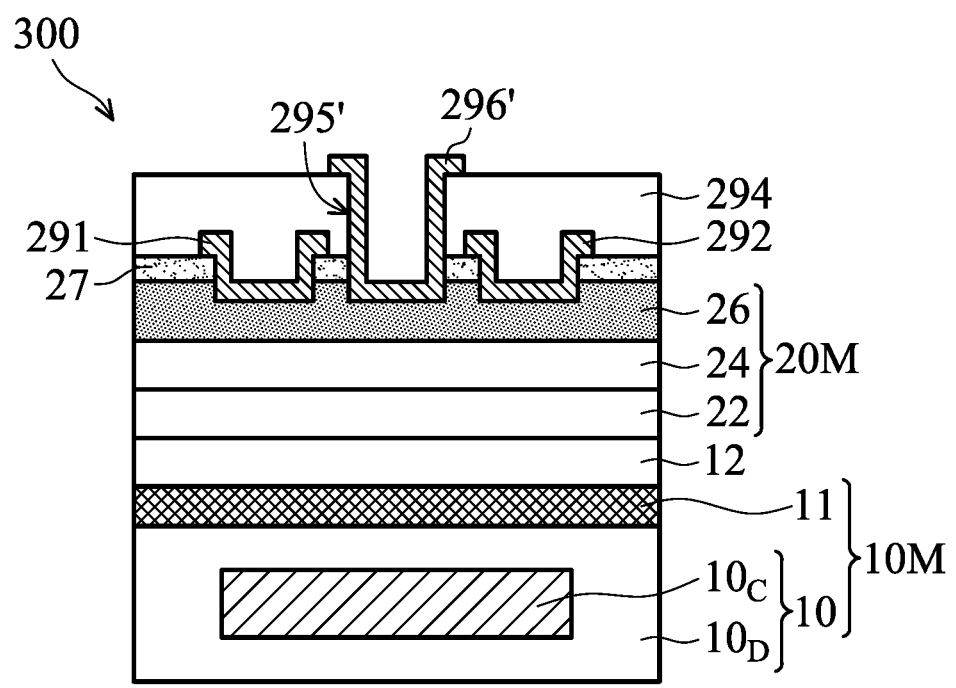
FIG. 3 is a cross-sectional view of a high electron mobility transistor (HEMT) in accordance with some embodiments of the present disclosure.

The structure of the high electron mobility transistor (HEMT) can be modified and adjusted depending on practical applications, and it is not limited to the exemplified structure as depicted in FIG. 2E. Referring to FIG. 3, the difference between the embodiments shown in FIG. 3 and FIG. 2E is that the third recess 295' in an HEMT 300 as shown in FIG. 3 is extended into the silicon-containing insulating layer 27 and the barrier layer 26. In the embodiment as shown in FIG. 3, the passivation layer 294 is a silicon-containing insulating material. The passivation layer 294 and the silicon-containing insulating layer 27 may be etched by an etching step similar to the first etching step 410A of the etching process 400 as shown in FIG. 2C. Next, the barrier layer 206 may be etched by another etching step similar to the second etching step 410B of the etching process 400 as shown in FIG. 2D to form the third recess 295'. In this embodiment, the gate electrode 296' is formed in the third recess 295', and the bottom surface of the gate electrode 296' is in direct contact with the barrier layer 26 to form the high electron mobility transistor (HEMT) 300.

In addition, in other embodiments, the method of manufacturing the high electron mobility transistor (HEMT) 300 further includes forming a gate structure (not shown) in the third recess 295' and embedded in the barrier layer 26 before forming the gate electrode 296'. Thereafter, the gate electrode 296' is formed in the remaining space of the third recess 295', and the gate electrode 296' is disposed on the gate structure. Additionally, in some embodiments, the gate structure is formed before forming the source electrode 291 and the drain electrode 292, and then the third recess 295' is formed to expose a portion of an upper surface of the gate structure. Thereafter, the gate electrode 296' is formed in the remaining space of the third recess 295'. In some embodiments, the gate structure is a doped GaN semiconductor layer, such as n-type GaN semiconductor layer or p-type GaN semiconductor layer. The gate structure may be formed by an epitaxial growth process, such as MOCVD, HVPE, MBE, a combination thereof, or the like. Moreover, the gate structure can be selectively formed. For example, in a depletion mode (i.e. normally-on) high-electron mobility transistor (HEMT), the gate structure can be omitted.

According to the structure manufactured by the method of some embodiments as shown in FIG. 2A-FIG. 2E, the conductive layer 11 is an upper layer of the composite substrate 10M, and the dielectric layer 12 covers the first surface 111 of the conductive layer 11. The GaN-containing composite layer 20M is disposed on the dielectric layer 12. The dielectric layer 12 not only covers the conductive layer 11, but also acts as a separation layer to prevent the related layers of the HEMT from directly contacting the conductive layer 11. Therefore, in the structure manufactured by the methods of some embodiments as shown in FIG. 2A-FIG. 2E, the second surface 112 of the conductive layer 11 directly contacts and covers an upper surface 101 of the base 10. The GaN-containing composite layer 20M, the source electrode 291, the drain electrode 292 and the gate electrode 296 are disposed above the first surface 111 of the conductive layer 11. As shown in FIG. 2E, the GaN-containing composite layer 20M, the source electrode 291, the drain electrode 292 and the gate electrode 296 are disposed on the dielectric layer 12.

Figure 4A:
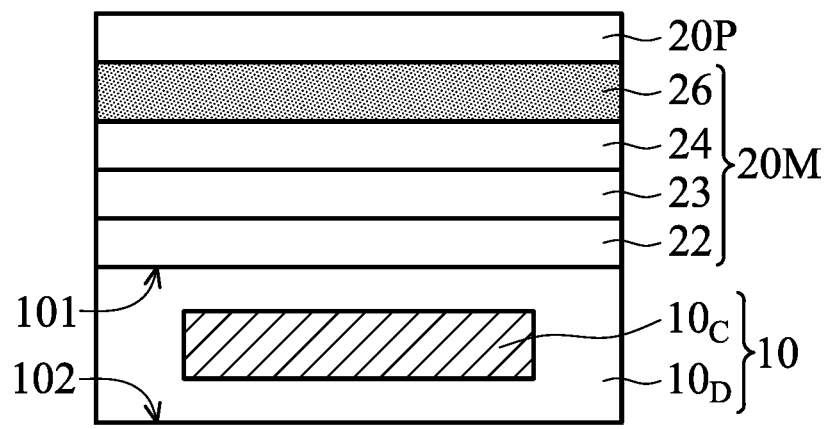
FIG. 4A, FIG. 4B and FIG. 4C illustrate cross-sectional views of intermediate stages of a method of manufacturing a semiconductor device in accordance with some embodiments of the present disclosure.
Figure 4B:
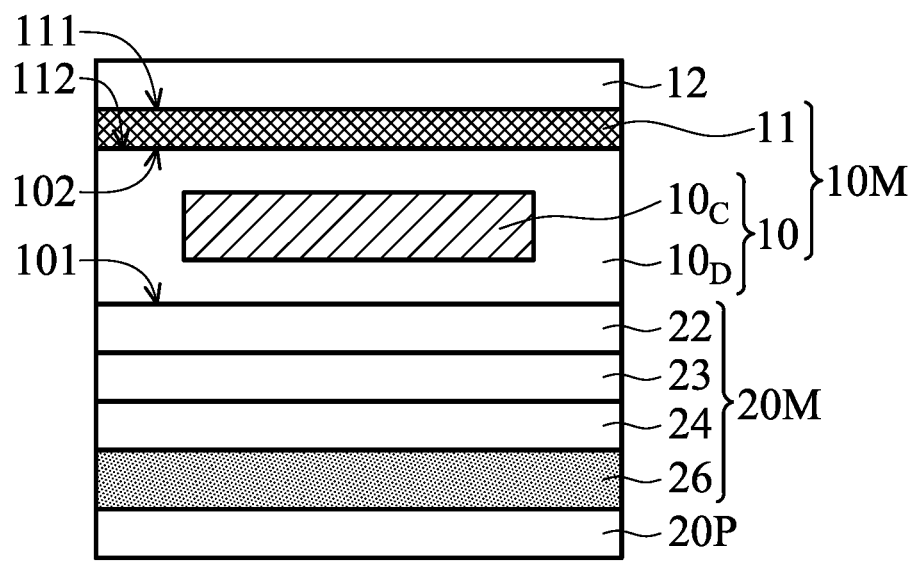
Figure 4C:
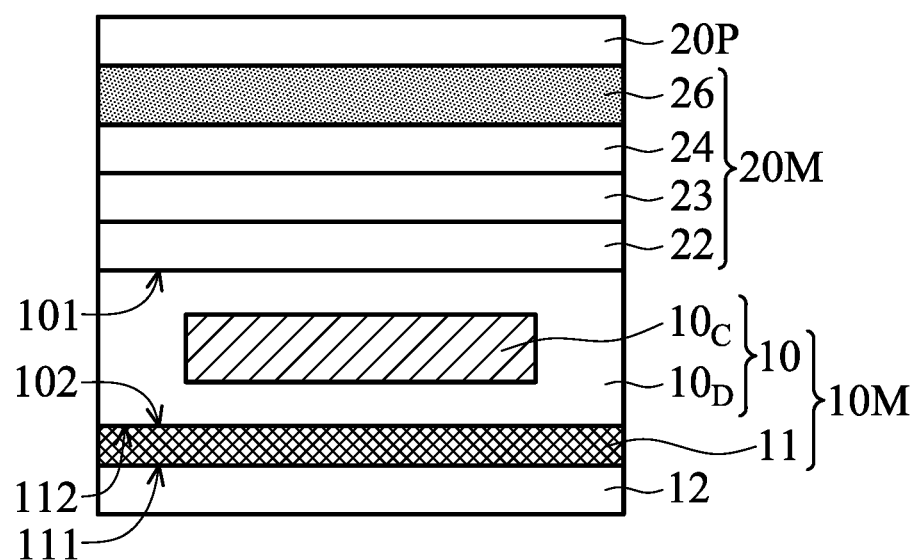

Referring to FIG. 4A-FIG. 4C. FIG. 4A-FIG. 4C illustrate cross-sectional views of intermediate stages of a method of manufacturing a semiconductor device in accordance with some embodiments of the present disclosure. Structures of FIG. 4A-FIG. 4C, processes for manufacturing the structures and materials of related layers of the structures identical or similar to that of FIG. 2A are not redundantly descried.

The difference between the methods as shown in FIG. 2A-FIG. 2E and FIG. 4A-FIG. 4C is that the GaN-containing composite layer 20M in the method of FIG. 4A-FIG. 4C is formed on the upper surface 101 of the base 10, and then a conductive layer 11 is formed on a lower surface 102 of the base 10. That is, in the method as shown in FIG. 4A-FIG. 4C, the conductive layer 11 is formed after forming the GaN-containing composite layer 20M, thereby completing the fabrication of the composite substrate 10M.

As shown in FIG. 4A, a base 10 is provided, and a GaN-containing composite layer 20M is formed on the upper surface 101 of the base 10. A silicon-containing insulating layer 20P is formed on the barrier layer 26 of the GaN-containing composite layer 20M.

Next, as shown in FIG. 4B, the structure including the base 10 is turned upside down, and a conductive layer 11 is formed on the lower surface 102 of the base 10. A dielectric layer 12 is then formed on the first surface 111 of the conductive layer 11 and covers the conductive layer 11.

In some embodiments of the present disclosure, the GaN-containing composite layer 20M further includes a silicon layer 23 formed between the buffer layer 22 and the channel layer 24, as shown in FIG. 4A-FIG. 4C.

Next, the structure in FIG. 4B is turned upside down again. As shown in FIG. 4C, the conductive layer 11 and the GaN-containing composite layer 20M are formed on two opposite surfaces of the base 10. Thereafter, related components such as source electrodes, drain electrodes and gate electrodes (not shown) of semiconductor devices, such as HEMTs, are subsequently formed on the GaN-containing composite layer 20M. Processes and materials for forming the source electrode, the drain electrode, the gate electrode, and the like, and structures of source/drain/gate electrode are formed, are similar to or the same as the descriptions in FIG. 2A-FIG. 2E described above. Those identical or similar details are not repeated herein.

According to the structure manufactured by the method of FIG. 4A-FIG. 4C, the GaN-containing composite layer 20M and the electrodes such as the source electrode, the drain electrode and the gate electrode (not shown) formed subsequently are formed on the upper surface of the base 10. The conductive layer 11 and the dielectric layer 12 are formed on the lower surface 102 of the base 10.

Therefore, in the semiconductor device manufactured by the method of FIG. 4A-FIG. 4C in accordance with some embodiments, the base 10 is disposed between the GaN-containing composite layer 20M and the conductive layer 11. The conductive layer 11 is disposed between the GaN-containing composite layer 20M and the dielectric layer 12. In the semiconductor device manufactured by the method of FIG. 2A-FIG. 2E in accordance with some embodiments, the conductive layer 11 is disposed between the base 10 and the GaN-containing composite layer 20M. Different configurations of the conductive layer 11 and the GaN-containing composite layer 20M can be obtained by these two manufacturing methods.

In addition, the conductive layer 11 of the structure manufactured by the method of FIG. 4A-FIG. 4C is a lower layer of the composite substrate 10M, and covered by the dielectric layer 12. As shown in FIG. 4C, the dielectric layer 12 covers the first surface 111 of the conductive layer 11, and the second surface 11 of the conductive layer 11 directly contacts and covers the lower surface 102 of the base 10. Despite the conductive layer 11 is located as the lowest layer of the composite substrate 10M, the conductive layer is covered by the dielectric layer 12. Consequently, the conductive layer 11 does not directly contact the processing machines in the subsequent processes, thereby preventing the material (e.g. metal) of the conductive layer 11 from diffusion in the subsequent high-temperature thermal processes and contaminating the processing machines.

Compared to a transparent and electrically insulating substrate applied in the current processes, the composite substrate 10M of the embodiments includes the conductive layer 11 and can be well set on an electrostatic chuck (i.e. E-Chuck) of the processing machine (such as the etching machine) without applying excessive voltage by a power supply coupled to the electrostatic chuck. The serve life of the processing machine can be extended since it is no need to apply a high voltage that is too large or even close to the maximum loading of the processing machine. Also, the composite substrate 10M of the embodiments can be clamped steadily on the chuck, and the pattern accuracy of the electrical components of a semiconductor device (such as HEMT) fabricated on the composite substrate 10M can be improved, thereby enhancing the electrical performance of the semiconductor device. Accordingly, whether the method as shown in FIG. 2A-FIG. 2E or the method as shown in FIG. 4A-FIG. 4C is selected for manufacturing a semiconductor device, the use of the composite substrate 10M including the conductive layer 11 in accordance with the embodiments has several advantages. For example, the stability of the composite substrate placed on the processing machines can be greatly enhanced, thereby improving electrical characteristics of the electrical components fabricated on the composite substrate 10M.

In addition, in some embodiments, the conductive layer 11 of the composite substrate 10M has a low transmittance or is opaque. In some embodiment, the conductive layer 11 includes a material that absorbs heat well. Whether the method as shown in FIG. 2A-FIG. 2E, the method as shown in FIG. 4A-FIG. 4C or other applicable method is selected for manufacturing a semiconductor device, the composite substrate 10M containing the aforementioned conductive layer 11 can steadily absorbs heat and accumulates more thermal energy in the thermal processes, so that the temperature of the entire composite substrate 10M can steadily increase. In the current methods, the time required for a conventional substrate to reach a desired temperature is inadequately extended, resulting in structural and/or electrical defects occurred in the layers/films of electrical components of semiconductor devices. In contrast with the current methods, the thermal processes can be completed in an adequate period of time by using a composite substrate 10M of the embodiments, thereby greatly improving electrical properties of electrical components fabricated on the composite substrate 10M.

Whether the method as shown in FIG. 2A-FIG. 2E, the method as shown in FIG. 4A-FIG. 4C or other applicable methods is selected for manufacturing a semiconductor device, the use of the composite substrate 10M including the conductive layer 11 in accordance with the embodiments is suitable for being used in the processing machines for manufacturing semiconductor devices. The composite substrate 10M of the embodiments can be clamped steadily on the chuck such that electrical characteristics of the electrical components fabricated on the composite substrate 10M can be greatly improved. Moreover, in some embodiments, the conductive layer 11 includes a conductive material resistant to high temperature such that the composite substrate 10M is suitable for being applied to subsequent high-temperature thermal processes. Moreover, in some embodiments, the conductive layer 11 includes a conductive material that is resistant to a high temperature and has a low transmittance, or is opaque. In other embodiments, the conductive layer 11 also has a property of heat absorption. Accordingly, the composite substrate 10M of the embodiments not only has a conductive effect, but also steadily increases the temperature of the entire composite substrate 10M in the subsequent high-temperature thermal processes, thereby greatly improving the performances of electrical components fabricated on the composite substrate 10M.

Figure 5A:
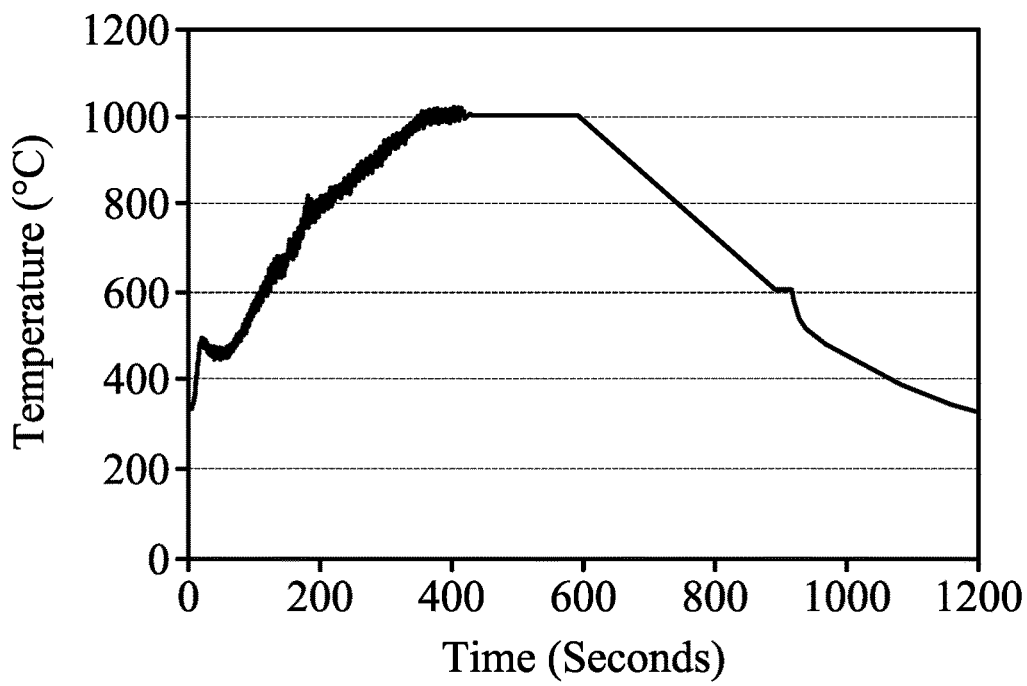
FIG. 5A is a graph of temperatures measured in a rapid thermal process (RTP) by using a conventional light-transmissive and non-conductive substrate.
Figure 5B:
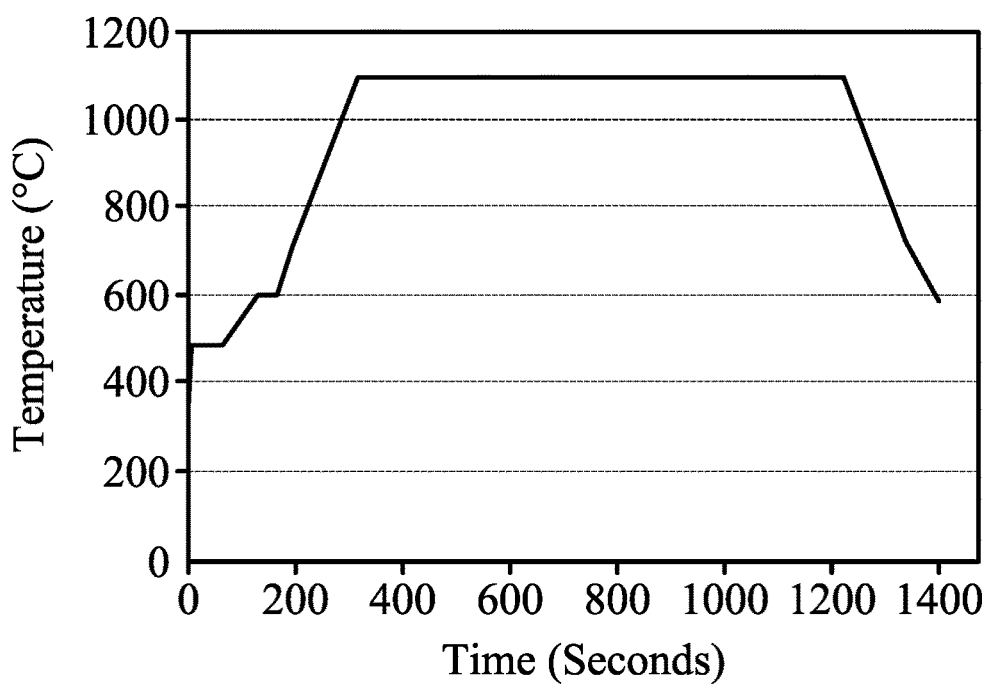
FIG. 5B is a graph of temperatures measured in a rapid thermal process (RTP) by using a conductive composite substrate with a low transmittance in accordance with some embodiments.

FIG. 5A and FIG. 5B are graphs of temperatures measured in a rapid thermal process (RTP) by using a conventional light-transmissive and non-conductive substrate and a conductive composite substrate with a low transmittance in accordance with some embodiments, respectively. In FIG. 5A and FIG. 5B, the temperatures of the substrates increase with the thermal time.

When the conventional light-transmissive and non-conductive substrate is used in the rapid thermal process, the sensor of the processing machine (typically disposed under the substrate) quickly detects a temperature required for performing the high-temperature thermal process, and the power supply is then turned off. However, this conventional substrate itself does not reach the temperature required for performing the rapid thermal process. Thus, after turning off the power supply, the sensor of the processing machine quickly detects a temperature lower than the temperature required for performing the rapid thermal process. The power supply of the processing machine is then automatically turned on for continuous heating. Heating and stop heating are alternately performed for many times during the rapid thermal process. As shown in FIG. 5A, the result has indicated that the conventional light-transmissive and non-conductive substrate presents a sawtooth-wave curve having a number of waves at the temperature rising segment. Such temperature variation indicates that an endothermic state of the conventional substrate in the rapid thermal process is very poor, especially the heat absorption during the critical temperature-increasing period. However, when the conductive composite substrate with a low transmittance in accordance with some embodiments is used in the rapid thermal process, the result has indicated that the temperature of the composite substrate rapidly and steadily increases during the critical temperature-increasing period, as shown in FIG. 5B. The temperature rising segment of the curve in FIG. 5B does not fluctuate up and down, indicating that the composite substrate of some embodiments has a stable temperature rising state in the rapid thermal process.

In addition, electrical tests of the semiconductor device such as HEMT have been performed, such as measuring the ohmic contact resistances (Rc). Several sets of experimental data have been provided below for exemplifications.

In those experiments, a conventional light-transmissive and non-conductive substrate and an opaque composite substrate containing a TIN conductive layer in accordance with some embodiments are used for fabricating the HEMTs, respectively. Thereafter, the source/drain access resistances of the fabricated HEMTs, that is, the ohmic contact resistances (Rc), are measured.

In some experiments, a rapid thermal process is performed at 900° C. for 60 seconds. One set of the experimental results indicated that an ohmic contact resistance (Rc) of the HEMT using the conventional light-transmissive and non-conductive substrate is about 23.7 ohm-mm. An ohmic contact resistance (Rc) of the HEMT using the opaque composite substrate containing a TIN conductive layer is about 5.0 ohm-mm. Thus, ohmic contact resistance (Rc) of a HEMT using the composite substrate of the embodiments can be greatly improved by about 450%.

In some experiments, a rapid thermal process is performed at 850° C. for 60 seconds. One set of the experimental results indicated that an ohmic contact resistance (Rc) of the HEMT using the conventional light-transmissive and non-conductive substrate is about 67 ohm-mm. An ohmic contact resistance (Rc) of the HEMT using the opaque composite substrate containing a TIN conductive layer is about 27.2 ohm-mm. Thus, ohmic contact resistance (Rc) of a HEMT using the composite substrate of the embodiments can be greatly improved by about 250%.

According to the experimental results, even when the high-temperature thermal process is performed at different temperatures, the semiconductor device using the composite substrate of the embodiments has a significantly reduced ohmic contact resistance (Rc), and the electrical properties of the semiconductor device are greatly improved.

In summary, compared to a transparent and electrically insulating substrate applied in the current processes, a composite substrate of the embodiments, such as a composite substrate including the conductive layer 11, is suitable for being used in the processing machines for manufacturing semiconductor devices, and can be steadily clamped on the chucks of the processing machines. Accordingly, the pattern accuracy of the electrical components of a semiconductor device fabricated on the composite substrate can be improved, thereby enhancing the electrical performance of the semiconductor device. Moreover, in some embodiments, the conductive layer 11 includes a conductive material resistant to high temperature such that the composite substrate 10M is suitable for being applied to subsequent high-temperature thermal processes. Moreover, in some embodiments, the conductive layer 11 includes a conductive material that is resistant to high temperature and has a low transmittance or is opaque. In other embodiments, the conductive layer 11 includes a conductive material with a property of good heat absorption. Accordingly, the composite substrate 10M of the embodiments is well set on the chuck of the processing machine, and the temperature of the entire composite substrate 10M steadily increases in high-temperature thermal processes, thereby greatly improving the performances of electrical components fabricated on the composite substrate 10M. Thus, the yield and the quality of electrical components fabricated on the composite substrate of the embodiments can be significantly enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a composite substrate comprising a base and a conductive layer, wherein the conductive layer continuously contacts and covers one of a lower surface and an upper surface of the base, wherein the conductive layer is a metal-containing layer, and the conductive layer has a light transmittance less than 40%;
   a dielectric layer formed over the composite substrate, and the dielectric layer physically contacting and covering the conductive layer, wherein the conductive layer is disposed between the dielectric layer and the base, and an entire plane of the dielectric layer extends in parallel with the upper surface of the base;
   a GaN-containing composite layer disposed on the composite substrate;
   a gate electrode disposed on the GaN-containing composite layer;
   a source electrode and a drain electrode disposed on the GaN-containing composite layer and at two opposite sides of the gate electrode.

2. The semiconductor device as claimed in claim 1, wherein the conductive layer comprises a metal, an alloy, a metal nitride, polysilicon or a combination thereof.

3. The semiconductor device as claimed in claim 1, wherein the conductive layer comprises Ti, Ta, W, Nb, Mo, V, an alloy or a nitride comprising a metal thereof.

4. The semiconductor device as claimed in claim 1, wherein the conductive layer comprises Ti, Ta, W, Nb, Mo, V, TaAl, TiW, TiN, TaN, TiAlN, TaAlN, WN, NbN, MoN, VN or a combination thereof.

5. The semiconductor device as claimed in claim 1, wherein the conductive layer comprises a conductive material having a melting point equal to or higher than 1400° C.

6. The semiconductor device as claimed in claim 1, wherein a thickness of the conductive layer is in a range of 50 nm to 500 nm.

7. The semiconductor device as claimed in claim 1, wherein the conductive layer comprises a conductive material resistant to a thermal process at a temperature greater than 600° C.

8. The semiconductor device as claimed in claim 1, wherein the base comprises a ceramic material layer and an insulating layer encapsulating the ceramic material layer.

9. The semiconductor device as claimed in claim 1, wherein the conductive layer and the dielectric layer are disposed between the GaN-containing composite layer and the base.

10. The semiconductor device as claimed in claim 1, wherein the base is disposed between the GaN-containing composite layer and the conductive layer.

11. The semiconductor device as claimed in claim 1, wherein the conductive layer has a first surface and a second surface opposite the first surface, wherein the dielectric layer covers the first surface of the conductive layer.

12. The semiconductor device as claimed in claim 11, wherein the second surface of the conductive layer directly contacts and covers the upper surface of the base, while the GaN-containing composite layer, the gate electrode, the source electrode and the drain electrode are disposed above the first surface of the conductive layer.

13. The semiconductor device as claimed in claim 11, wherein the second surface of the conductive layer directly contacts and covers the lower surface of the base, and the GaN-containing composite layer is disposed above the upper surface of the base.

14. The semiconductor device as claimed in claim 1, wherein the GaN-containing composite layer comprises a buffer layer, a channel layer on the buffer layer and a barrier layer on the channel layer.

15. A method of manufacturing a semiconductor device, comprising:
   providing a base;
   forming a conductive layer on the base, wherein the conductive layer continuously contacts and covers one of a lower surface and an upper surface of the base, wherein the conductive layer is a metal-containing layer, and the conductive layer has a light transmittance less than 40%;
   forming a dielectric layer over the composite substrate, the dielectric layer physically contacting and covering the conductive layer, wherein the conductive layer is positioned between the dielectric layer and the base, and an entire plane of the dielectric layer extends in parallel with the upper surface of the base;
   forming a GaN-containing composite layer above the base;
   forming a source electrode and a drain electrode on the GaN-containing composite layer; and
   forming a gate electrode on the GaN-containing composite layer, wherein the gate electrode is located between the source electrode and the drain electrode.

16. The method as claimed in claim 15, wherein the conductive layer comprises a metal, an alloy, a metal nitride, polysilicon or a combination thereof.

17. The method as claimed in claim 15, wherein the conductive layer comprises Ti, Ta, W, Nb, Mo, V, an alloy or a nitride comprising a metal thereof.

18. The method as claimed in claim 15, wherein the conductive layer comprises Ti, Ta, W, Nb, Mo, V, TaAl, TiW, TiN, TaN, TiAlN, TaAlN, WN, NbN, MoN, VN or a combination thereof.

19. The method as claimed in claim 15, wherein the conductive layer comprises a conductive material having a melting point equal to or higher than 1400° C.

20. The method as claimed in claim 15, wherein a thickness of the conductive layer is in a range of 50 nm to 500 nm.

21. The method as claimed in claim 15, wherein the base comprises a ceramic material layer and an insulating layer encapsulating the ceramic material layer, and the conductive layer covers a surface of the insulating layer.

22. The method as claimed in claim 15, wherein the GaN-containing composite layer is formed on the dielectric layer after one of the lower surface and the upper surface of the base is covered by the conductive layer and the conductive layer is covered by the dielectric layer.

23. The method as claimed in claim 15, comprising forming the GaN-containing composite layer on the upper surface of the base, followed by turning the base upside down and then forming the conductive layer to cover the lower surface of the base.

24. The method as claimed in claim 23, wherein forming the dielectric layer to cover the conductive layer is performed after the lower surface of the base is covered by the conductive layer.

25. The method as claimed in claim 24, wherein after forming the dielectric layer to cover the conductive layer, the base is turned upside down again, and then the source electrode and the drain electrode are formed on the GaN-containing composite layer.

26. The method as claimed in claim 15, wherein forming the GaN-containing composite layer comprises:
   forming a buffer layer;
   forming a channel layer on the buffer layer; and
   forming a barrier layer on the channel layer.

\* \* \* \* \*